United States Patent
Kreutz et al.

(10) Patent No.: US 9,882,082 B2
(45) Date of Patent: Jan. 30, 2018

(54) COMPOSITIONS AND PROCESSES FOR FABRICATION OF REAR PASSIVATED SOLAR CELLS

(71) Applicant: SUN CHEMICAL CORPORATION, Parsippany, NJ (US)

(72) Inventors: Ted Kreutz, Roseland, NJ (US); Jin-An He, Mountain Lakes, NJ (US); Joel Garcia, North Bergen, NJ (US); Maura Mostowy-Gallagher, Succasunna, NJ (US); Graham Robins, Lafox, IL (US); Monica Liu, Aurora, IL (US)

(73) Assignee: SUN CHEMICAL CORPORATION, Parsippany, NJ (US)

( * ) Notice: Subject to any disclaimer, the term of this patent is extended or adjusted under 35 U.S.C. 154(b) by 86 days.

(21) Appl. No.: 14/442,024

(22) PCT Filed: Oct. 18, 2013

(86) PCT No.: PCT/US2013/065626
§ 371 (c)(1),
(2) Date: May 11, 2015

(87) PCT Pub. No.: WO2014/078011
PCT Pub. Date: May 22, 2014

(65) Prior Publication Data
US 2015/0295123 A1    Oct. 15, 2015

Related U.S. Application Data

(60) Provisional application No. 61/726,223, filed on Nov. 14, 2012, provisional application No. 61/782,462, filed on Mar. 14, 2013.

(51) Int. Cl.
*H01L 31/0687* (2012.01)
*H01L 31/042* (2014.01)
(Continued)

(52) U.S. Cl.
CPC ............ *H01L 31/186* (2013.01); *C09D 11/10* (2013.01); *C09D 161/06* (2013.01);
(Continued)

(58) Field of Classification Search
CPC ..... H01L 31/043; H01L 31/06; H01L 31/078; H01L 31/02008
See application file for complete search history.

(56) References Cited

U.S. PATENT DOCUMENTS

| 4,324,715 A | 4/1982 | Emerick |
| 5,340,701 A | 8/1994 | Desobry |

(Continued)

FOREIGN PATENT DOCUMENTS

| CN | 101085899 A | 12/2007 |
| EP | 1 630 600 A2 | 3/2006 |

(Continued)

OTHER PUBLICATIONS

European Search Report from European Application No. 13854955.5, dated Oct. 11, 2016.
(Continued)

*Primary Examiner* — Mohammad Choudhry
(74) *Attorney, Agent, or Firm* — Charles C. Achkar; Ostrolenk Faber LLP

(57) ABSTRACT

Compositions used in, and methods for, fabricating a rear-passivated silicon solar cell are described. A novel method of opening the back surface for contacting the silicon with a conventional aluminum paste is described. Various novel screen printable etch resists are described. First, such an etch resist can be printed on the rear of a rear-passivated solar cell wafer. The passivation layer can then be removed using a wet etch, and next the etch resist layer can be removed. Further, an additional wet etch step may optionally be used to deepen the opening into the silicon and enhance the BSF (Continued)

Exemplary screen pattern for printing etch resists. The black lines represent the non-print areas. The white area is open area of the screen. The print is a solid area of etch resist with open lines. The exemplary pattern consists of three repeating sets of lines of the following widths: 200, 175, 150, 125, 100, 75, and 50 microns (back-surface field). Aluminum paste can then be printed over the entire backside of the now etched cell. The entire cell is then fired. In exemplary embodiments of the present invention, the paste can be chosen so that it will not fire through the passivation layer.

31 Claims, 5 Drawing Sheets

(51) Int. Cl.
    *H01L 31/18*     (2006.01)
    *C09D 11/10*     (2014.01)
    *H01L 31/0224*     (2006.01)
    *H01L 31/068*     (2012.01)
    *C09D 161/06*     (2006.01)

(52) U.S. Cl.
    CPC .... *H01L 31/022425* (2013.01); *H01L 31/068* (2013.01); *H01L 31/1804* (2013.01); *Y02E 10/547* (2013.01)

(56) References Cited

U.S. PATENT DOCUMENTS

| | | |
|---|---|---|
| 6,210,862 B1 | 4/2001 | Day et al. |
| 2004/0075802 A1 | 4/2004 | Kitamura et al. |
| 2004/0167268 A1 | 8/2004 | Vathauer et al. |
| 2005/0022862 A1 | 2/2005 | Cudzinovic et al. |
| 2007/0256352 A1 | 11/2007 | Wood et al. |
| 2007/0295688 A1 | 12/2007 | Kim |
| 2008/0121621 A1 | 5/2008 | Stockum et al. |
| 2008/0264902 A1 | 10/2008 | Song et al. |
| 2010/0173446 A1 | 7/2010 | Khandilkar et al. |
| 2011/0020970 A1 | 1/2011 | Caiger |
| 2012/0085965 A1 | 4/2012 | Doll et al. |
| 2012/0164777 A1 | 6/2012 | Kleine et al. |

FOREIGN PATENT DOCUMENTS

| | | |
|---|---|---|
| KR | 10-2012-0113548 A | 10/2012 |
| WO | WO-2002/085962 A1 | 10/2002 |

OTHER PUBLICATIONS

European Search Report from European Application No. 13854955.5, dated Oct. 14, 2015.
International Search Report issued in International application No. PCT/US2013/065626, dated Feb. 20, 2014.
Notification Concerning Transmittal of International Preliminary Report on Patentability (Chapter 1 of the Patent Cooperation Treaty) issued in PCT/US2013/065626, dated May 19, 2015.
Chinese Office Action issued in Chinese Application No. 201380059482.1, dated Dec. 5, 2016. (with English Translation).

Exemplary screen pattern for printing etch resists. The black lines represent the non-print areas. The white area is open area of the screen. The print is a solid area of etch resist with open lines. The exemplary pattern consists of three repeating sets of lines of the following widths: 200, 175, 150, 125, 100, 75, and 50 microns

COMPOSITIONS AND PROCESSES FOR FABRICATION OF REAR PASSIVATED SOLAR CELLS

CROSS REFERENCE TO RELATED APPLICATIONS

The present application is a § 371 National Phase application based on PCT/US2013/065626 filed Oct. 18, 2013, which claims the benefit of benefit of U.S. Provisional Patent Applications Nos. 61/726,223, filed on Nov. 14, 2012, and 61/782,462, filed on Mar. 14, 2013. The disclosures of each of these applications are hereby fully incorporated herein by reference in their entirety.

TECHNICAL FIELD

The present invention relates to solar cell fabrication, and in particular to compositions and processes for fabrication of rear-passivated solar cells using a wet etch process.

BACKGROUND OF THE INVENTION

Conventional methods for contacting a rear-passivated solar cell use laser ablation of the silicon wafer. In such methods, a high power laser is fired over the rear surface of the cell, which thermally ablates the deposited passivation layer. This process has several disadvantages. First, laser ablation damage of the silicon underneath the surface lowers the cell efficiency. Second, because the laser must raster over the entire surface area, the process can be time-consuming. Laser ablation is not amenable to producing intricate shapes and high resolution detail in the rear surface, which can increase efficiency. Moreover, this method is not able to control the depth into the solar cell. This is significant because the final efficiency of the cell can be dependent on the depth of the opened surface, and as a laser ablates more material, this generally results in greater thermal damage to the substrate and a corresponding lower efficiency.

What is thus needed in the art are improved methods of fabricating rear-passivated solar cells that overcome the problems of conventional approaches, such as laser ablation.

SUMMARY OF THE INVENTION

Compositions used in, and methods for, fabricating a rear-passivated silicon solar cell are described. A novel method of opening the back surface for contacting the silicon with a conventional aluminum paste is described. Various novel screen printable etch resists are described. First, such an etch resist can be printed on the rear of a rear-passivated solar cell wafer. The passivation layer can then be removed using a wet etch, and next the etch resist layer can be removed. Further, an additional wet etch step may optionally be used to deepen the opening into the silicon and enhance the BSF (back-surface field). Aluminum paste can then be printed over the entire backside of the now etched cell. The entire cell is then fired. In exemplary embodiments of the present invention, the paste can be chosen so that it will not fire through the passivation layer.

DETAILED DESCRIPTION OF THE INVENTION

Figure 1:
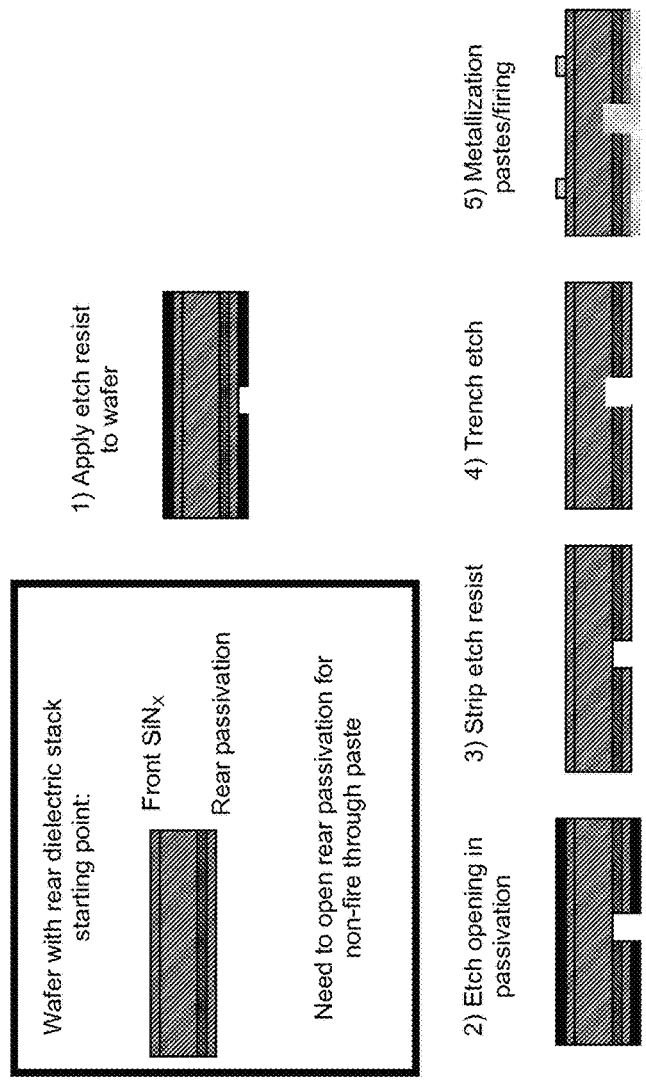
FIG. 1 depicts an exemplary rear-passivated silicon solar cell fabrication process according to exemplary embodiments of the present invention.

Methods of fabricating a rear-passivated silicon solar cell are described. In particular, compositions and methods for preparing a rear-passivated solar cell for the attachment of electrical contacts using innovative etch resists, and wet etching.

As noted above, conventional silicon solar cells with rear-side passivation provide advantages over non-passivated wafers, but electrical contacts to the rear of the silicon wafer must be made through the non-conducting passivation layers. In what follows, a novel method of preparing the back surface of a solar cell for contacting the silicon with a conventional aluminum paste is described. In exemplary embodiments of the present invention, first, a screen printable etch resist pattern can be printed on the rear of a passivated wafer, as shown, for example, in FIG. 1. The passivation layer can then be selectively removed and thus patterned using a wet etch, and next the etch resist layer can be removed. Further, an additional wet etch step may optionally be used to deepen the opening into the silicon and enhance the BSF (back-surface field). Finally, an aluminum paste can then be printed over the entire backside and fired. In exemplary embodiments of the present invention, the aluminum paste can be chosen, for example, so that it will not fire through the passivation layer.

A wet etch technique will result in higher efficiencies than a laser process, due to the damage caused by such laser ablation processes, as described above. However, heretofore no solution has been developed that can allow a wet chemical etch to be integrated in a high-throughput setting.

In exemplary embodiments of the present invention, the various problems associated with laser ablation are solved. Such exemplary methods are streamlined, where small details can easily be screen printed using a high resolution printable etch resist, and where the chemical etches will not damage the wafers. Furthermore, the inventors have observed that back-surface fields ("BSFs") created by the proposed method are thicker and conform better to the perimeter than with a laser fired contact. They have further observed that BSF formation on wet etched samples is greater than that for laser fired openings (see FIG. 2 for exemplary comparison images). It is noted that the BSF is a region of degeneratively aluminum doped silicon that is created when the aluminum paste and silicon melt and subsequently solidify during the firing. This layer provides an electric field enhancement near the electrical contact, and increases the number of carriers that flow to the contact. If there are any breaks in the BSF near a passivation layer, this can result in shunting currents when oppositely charged carriers near the surface recombine with the majority carriers. Good BSF thickness and shape is thus crucial to high efficiency, and these features are improved when using processes according to the present invention, when compared to conventional methods.

Exemplary embodiments according to the present invention offer commercial advantages in that throughput is higher, while the equipment needed will generally already be established for a factory using print/etch/rinse methods.

Thus, in exemplary embodiments of the present invention, a rear-side dielectric passivation layer, or stack, can, for example, be opened by using a screen printable etch resist followed by a wet etch process. The screen printable etch resist can comprise one of the novel compositions described herein, which thus facilitates the use of wet etch processes with greater throughput and at much greater resolutions. As noted, in the past, it has been time consuming to provide an etch resist and pattern the resist using photolithography methods (i.e. patterning a resist, using UV light to selectively develop the resist, and then rinsing the developed resist away), or by using a plasma etch. However, the latest generation of etch resist pastes provided by Applicant/Assignee hereof, Sun Chemical of Parsippany, N.J., USA, can be (i) screen printed at very high resolutions, (ii) quickly cured and (ii) used as an etch resist to etch a pattern into the rear of a solar cell for passivated emitter-rear contact (PERC) solar cells so that (iv) an aluminum paste can then be fired on top of the passivated layer. Examples of such novel etch resist pastes provided by Sun Chemical are CXT-0597; XZ77; and ESTA-1150. Exemplary formulations are described in Table 1 below.

Such etch resists are able to sufficiently adhere to substrates so as to protect the printed areas from the wet chemical etching bath. This process can, for example, either remove the passivating layers only, or, for example, can also be used to etch a controlled trench in the rear surface of the silicon. The etch resist can then be removed using a stripping bath that will quickly remove the etch resist without affecting exposed areas of the wafer. Then, if desired, a further trench can be wet-etched into the device using a standard wet etch recipe that does not harm the passivating layer. Examples of such wet etch solutions include, for example, aqueous KOH or TMAH.

In exemplary embodiments of the present invention, a screen printable etch resist with very high resolution fine line printing capability can be used. This technique provides several advantages. First, the composition can be designed to have a rheological profile that allows high precision features to be patterned onto the passivated layer using a screen printing process. Next, the formulation may preferably have excellent adhesion to the passivation layer to (i) minimize undercutting of the etchant and (ii) enhance resistance to the etchant. In exemplary embodiments of the present invention, the combination of high precision printability and etchant resistance allows for high precision patterning, which is a critical feature of the PERC process. The components of the etch resist can preferably have a high level of resistance to the etchant so that the printed wafer can be able to withstand a sufficient exposure time without degradation. Thus, the printed protected areas of the passivation layer remain intact during the etching step, however, the etch resist composition can, for example, preferably still rapidly degrade during the removal step to preserve the high throughput aspect of the process. Ease of removability is an important feature of a printable etch resist. In exemplary embodiments of the present invention, the printed etch resist can preferably be removed completely during the etch resist stripping step so that no residue of the etch resist is left behind following the removal step.

In exemplary embodiments of the present invention, an etch resist can be comprised of any of the following, or various combinations of the following components: a phenol-formaldehyde resin, such as a novolac resin or a resol; a vinyl polymer or copolymer; a vinyl acetate polymer or copolymer; a rosin resin or a modified rosin resin, such as a maleic, fumaric, phenolic, or otherwise modified rosin or rosin ester; a rosin polyester; a gum rosin or a modified ester of a gum rosin; shellac; melamine or modified melamine resin; cyclized rubber; or Gilsonite or uintahite resin.

In one example, a novolac resin can be in the range of 5% to 50%, but preferably in the range of 15-25% wt/wt (it is noted that unless otherwise specified, all percentages described herein are by weight). Also included is a vinyl co-polymer, such as, for example, 2-butenoic acid, vinyl acetate copolymer, in the range of 1% to 40%, but preferably in the range of 5-15%.

In another example, a system can comprise shellac, a fumaric or maleic modified resin, a phenolic resin, and a melamine resin. The shellac may be in the range of 0.1 to 30%, and preferably is in the range of 1-10%. The maleic modified resin may be in the range of 0.1 to 50%, and is preferably is in the range of 2-8%. The phenolic resin may be used in the range of 0.1% to 50%, and preferably in the range of 15-25%. The melamine resin may be in the range of 0.1% to 75%, but is preferably in the range of 5-10%.

The etch resist may also contain inorganics to function as rheological modifiers and also to impart fine printability, resistance and alkali-removable properties to the dried film. Examples include fumed silica, in the range of 1% to 30%, preferably in the range of 10% to 20%, including treated silica such as hydrophobic or hydrophilic silica; and clay, such as, for example, a kaolinite clay, bentonite, bentone, illite or muscovite, or chlorite, or a montmorillonite type clay, such as for one example a talc, in the range of 0.1% to 30%, and preferably in the range of 5-15%. An organoclay may also be used in the range of 0.1% to 12%, and preferably in the range of 1-5%. A fumed silica glass may be used in the range of 0.1% to 40%, and preferably in the range of 5-15%.

A colorant may also be used in the formulation. Suitable colorants include, but are not limited to, organic or inorganic pigments and dyes. The dyes include but are not limited to azo dyes, anthraquinone dyes, xanthene dyes, azine dyes, combinations thereof and the like. Organic pigments may be one pigment or a combination of pigments, such as for instance Pigment Yellow Numbers 12, 13, 14, 17, 74, 83, 114, 126, 127, 174, 188; Pigment Red Numbers 2, 22, 23, 48:1, 48:2, 52, 52:1, 53, 57:1, 112, 122, 166, 170, 184, 202, 266, 269; Pigment Orange Numbers 5, 16, 34, 36; Pigment Blue Numbers 15, 15:3, 15:4; Pigment Violet Numbers 3, 23, 27; and/or Pigment Green Number 7. Inorganic pigments may be one of the following non-limiting pigments: iron oxides, titanium dioxides, chromium oxides, ferric ammonium ferrocyanides, ferric oxide blacks, Pigment Black Number 7 and/or Pigment White Numbers 6 and 7. Other organic and inorganic pigments and dyes can also be employed, as well as combinations that achieve the colors desired. Preferred are acid resistant colorants.

In exemplary embodiments of the present invention, clear versions of the formulations may also be used, which do not contain colorants. Formulations with or without colorants may contain an optical brightener or other visual indicator or mixture of indicators.

The addition of waxes, such as amide or polyamide waxes, to the etch resist formulation has the special property of simultaneously improving the rheology and printability of the etch resist, but also improving resistance to the etchant bath (which may be, for example, hydrofluoric acid, or a combination of acids, such as nitric and hydrofluoric acids, or a combination of acids and buffering salts), the rate of alkali strippability following the etching step, and the print resolution of the etch resist. The wax can be used in the range of 0.1% to 45%, with a preferred range being 1% to 10%. Other components may also be used to achieve these properties, including derivatives of unsaturated oils or triglycerides, such as modified derivatives of castor oil, one particular example of which is Thixatrol® ST, an organically modified castor oil derivative supplied by Elementis Specialties. Especially preferred amide or polyamide waxes are the Crayvallac® family of rheological additives, such as castor derivatives, amide modified castor derivatives, and amides or polyamides, produced by Arkema Coating Resins.

In exemplary embodiments of the present invention, the solvents used can include various high boiling glycol ether solvents and may include, among others: ethylene glycol monomethyl ether, ethylene glycol monoethyl ether, ethylene glycol monopropyl ether, ethylene glycol monobutyl ether, diethylene glycol monomethyl ether, diethylene glycol monomethyl ether acetate, diethylene glycol monoethyl ether, diethylene glycol monoethyl ether acetate, diethylene glycol monopropyl ether, diethylene glycol butyl ether, diethylene glycol dibutyl ether, propylene glycol monomethyl ether, propylene glycol monomethyl ether acetate, propylene glycol monoethyl ether, propylene glycol monoethyl ether acetate, propylene glycol monopropyl ether, propylene glycol monopropyl ether acetate, propylene glycol monobutyl ether, propylene glycol phenyl ether, propylene glycol monobutyl ether acetate, dipropylene glycol monomethyl ether, dipropylene glycol methyl ether acetate, or diacetone alcohol, aromatic hydrocarbons or aromatic hydrocarbon mixtures, such as Solvesso, or naphtha, 2,2,4-trimethyl-1,3,-pentanediol monoisobutyrate (Texanol), 2,2,4-trimethyl-1,3-pentanediol diisobutyrate (TXIB), or a dibasic ester or mixture of dibasic esters, such as any or all of esters of dicarboxylic acids, such as adipic acid, glutaric acid, and succinic acid.

Process Examples

The following examples illustrate specific exemplary aspects of the present invention and are not intended to limit the scope thereof in any respect, and should not be so construed.

FIG. 1 illustrates an exemplary process for contacting the rear of an exemplary rear passivated solar cell. With reference thereto, conventionally manufacturers typically start with a silicon wafer that has been coated on the front, or sun-facing side, with an antireflective coating. The rear of the wafer is coated with a dielectric passivation coating. Methods to contact the rear of the wafer are carried out by one of two main processes. First, the passivation layer may be ablated away by a high-powered laser, as described above, which thus removes the rear passivation layer. Second, an etchant paste may be printed onto the wafer and then cured in order to selectively remove portions of the passivation. After each of these steps, the wafer is ready for metallization.

In the inventive process, after an exemplary wafer is processed with the front anti-reflective coating and rear passivation coating, the wafer is coated with a screen-printable etch resist. The front of the wafer may or may not be coated depending on the need to protect it during the etch steps. After the etch resist paste is dried and cured, the wafers can, for example, be floated across an etching bath, which will chemically etch the passivation layer and may or may not etch into the silicon substrate. The etching bath typically consists of an aqueous solution of an acid or mixture of acids, which may include hydrofluoric acid, or hydrofluoric acid mixed with nitric acid or other acids. The etching bath will chemically react with exposed (unprinted) areas of the wafer, dissolving them away, leaving the printed, patterned areas intact. The etch resist layer is formulated to withstand chemical attack from the etching bath, and to adhere to the substrate and prevent undercutting of non-exposed printed areas of the wafer. The etch resist is then stripped away using a fluid, which may be an alkali solution, an organic solvent, or other fluid. An alkali stripping bath fluid may contain a dilute aqueous solution of a hydroxide, such as, for example, sodium hydroxide or potassium hydroxide. The stripping process may comprise a flotation bath that employs a static immersion or agitation, sonication, or spraying, for example. A final etch step may be used which will deepen the etched trench into the silicon wafer.

The inventive process thus eliminates the need for the laser etch, which can slow processing time and also damage the wafer, resulting in lower efficiency. The etchant paste method will also result in longer throughput times when compared to the wet etch process. Etchant pastes are also not specifically designed for an arbitrary passivation layer or stack of layers and will be less efficient to varying material stacks as is often seen in practice.

Figure 2:
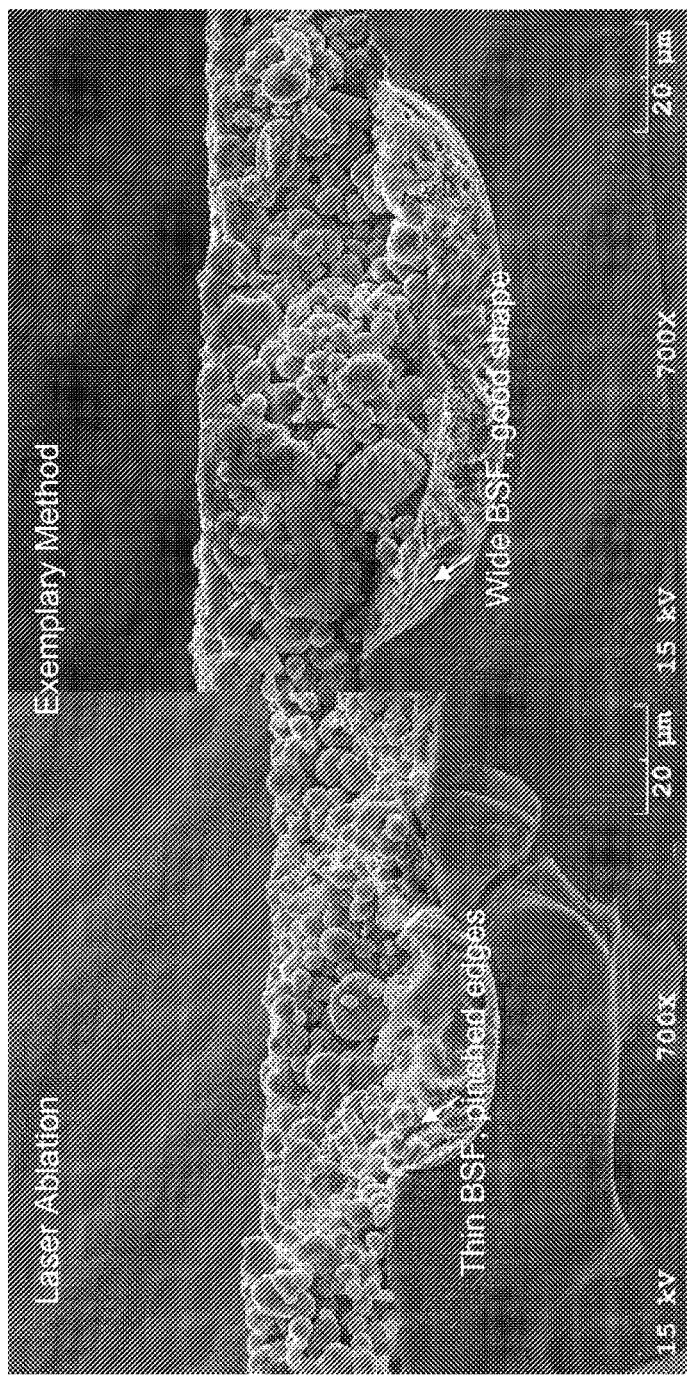
FIG. 2 shows two SEM (scanning electron microscope) images of the same aluminum paste fired on a passivated solar cell, the left side using conventional means, the right side according to methods of an exemplary embodiment of the present invention.
Figure 2A:
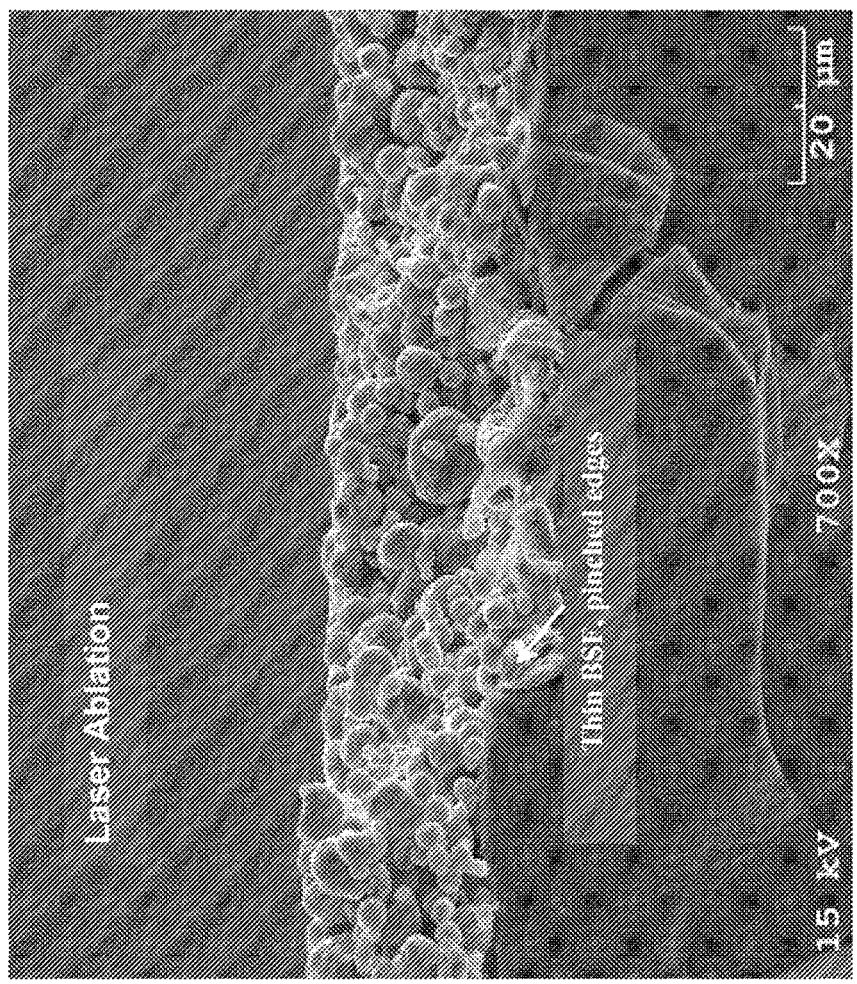
FIGS. 2A and 2B are magnified versions of the two views of FIG. 2, respectively.
Figure 2B:
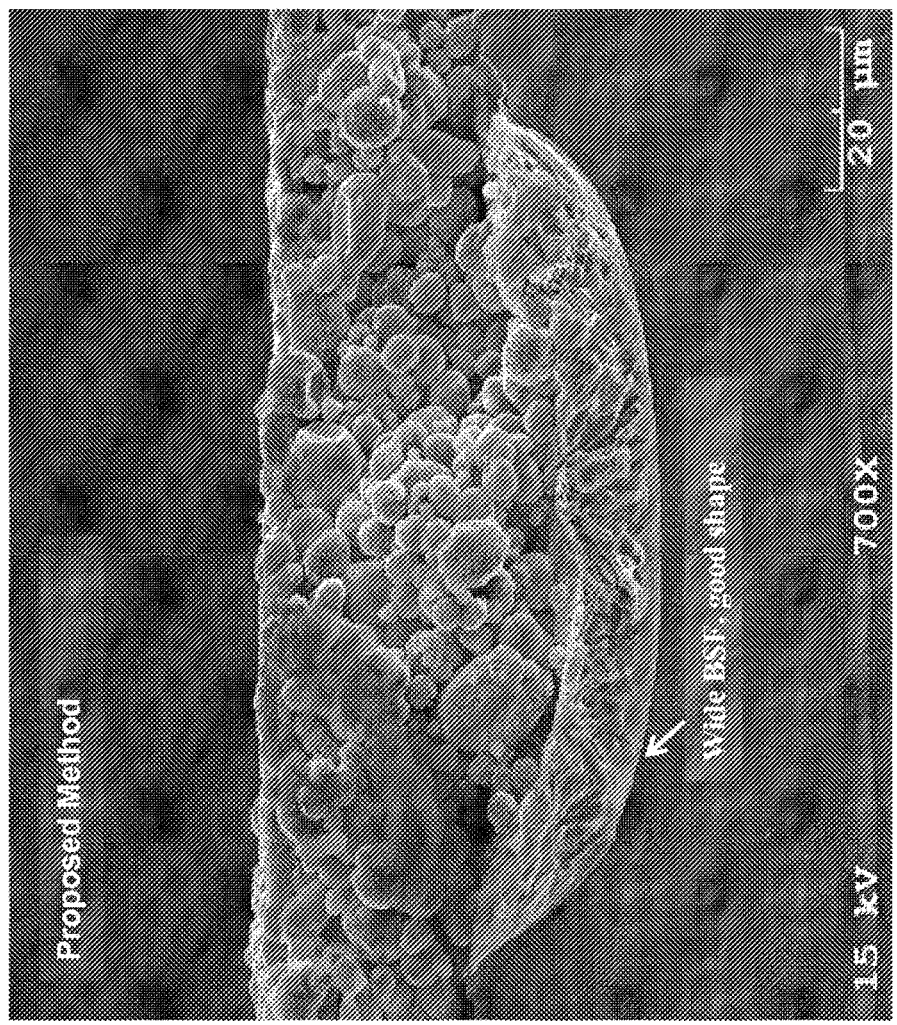

FIG. 2 shows two SEM (scanning electron microscope) images of the same aluminum paste fired on a passivated solar cell. The cells started off as two identically manufactured cells with an anti-reflective coating and a rear passivation coating, as shown in FIG. 1. The openings in the passivation are from laser fired openings in the left image, and the inventive process in the right image. The aluminum pastes in these experiments are identical and have the same paste laydown (printed weight per area). The cells were then fired in a BTU furnace under standard solar cell processing conditions. After firing, the cells were scribed for cross-sectional microscopy, and the edges chemically polished with a hydrofluoric/nitric/acetic acid dip. This dip only polishes the edge of the wafer for ease of visualizing the cross section by microscopy and does not measurably harm the wafer in any other way.

When fired, the pastes melt into the silicon substrate creating the depression. The thin halo-like feature surrounding the depression is the back-surface field (BSF). In order to achieve good cell efficiencies, it has been shown in the art that this BSF would preferably conform to the entire shape of the depression, extend along the full dimensions of the depression, and be as thick as possible. As shown, with the inventive process, thicker and more uniformly thick BSF layers are achieved as compared to the conventional laser process. Furthermore, the BSF layer is fully formed along the outer edge of the depression in the inventive process when compared to the standard. This, coupled with the lack of damage to the substrate during the process as is seen in prior art methods, results in higher efficiency.

Compositional Examples

Table 1 below provides formulas for Inventive Examples 1, 1A, 2, and 3 Etch Resists, and Comparative Examples 4 and 5 (prior or known formulations) etch resists. It is noted that Example compositions 1 and 1A are identical except for the presence of a pigment.

Example 1 includes pigment black, and Example 1A includes an optical brightener, and is thus clear. It is often useful for an etch resist to be clear, so that the effects of various processing steps following its application can be seen.

As can be seen with reference to Table 1, one of the novel ingredients in compositions 1, 1A and 3 is the micronized amide wax modifier. As seen, it is not included in conventional formulation examples 4 or 5. This material provides the opposing features/requirements of (i) extreme resistance to the etching bath, and (ii) very high susceptibility to the stripping bath solution. It helps the etch resist to break down very rapidly and completely during the removal step, so that no un-dissolved flakes of coating are left behind in the effluent bath. Additionally, due to the high resistance to the etching bath, it prevents undercutting of the etch resist, which obviously degrades the possible resolutions that can be obtained. Finally the micronized wax provides high shear thinning rheological behavior which is what facilitates high resolution printing. Thus, while pushed through a screen, and thus subject to high shear forces, it thins, and thus flows through the screen at a low viscosity, as soon as the shear forces cease (i.e., once through the screen), it returns to a high viscosity state, and thus "stays put" precisely where it is desired. It is noted that Example composition 2 does not include micronized wax, but does include more talc and fumed silica. This latter component imparts rapid strippability. However, it is noted that in too high a percentage, it can compromise resistance to the etching bath. It is also seen that inventive examples 1, 1A and 3 include organoclay. This improves rheology and print resolution. It is also noted that the organoclay, like the amide wax of Examples 1, 1A and 3, is a rheological modifier. It acts to delay the recovery of viscosity, in other words, it functions as a thixotropic agent. It works well in similar formulations, but may generally not be sufficient, in and of itself, for high definition printing applications. For this reason Examples 1, 1A and 3 also include the amide wax in addition.

TABLE 1

Formulas for Inventive Examples 1, 1A, 2, and 3 Etch Resists, and Comparative Examples 4 and 5 etch resists. (footnotes on following page)

| Material | Example 1 (Inventive) | Example 1A (Inventive) | Example 2 (Inventive) | Example 3 (Inventive) | Example 4 (Comp.) | Example 5 (Comp.) |
|---|---|---|---|---|---|---|
| Ethylene glycol monobutyl ether | 19.9 | 20.3 | 23.9 | — | 20.9 | 19.6 |
| Diethylene glycol mono ethyl ether | — | — | — | 19.1 | — | — |
| Diethylene glycol mono ethyl ether acetate | 27.8 | 28.6 | — | 28.6 | 31.2 | 29.4 |
| Diethylene glycol butyl ether | — | — | 14.1 | — | — | — |
| Copolymer of 2-butenoic acid and ethenyl acetate[1] | 10.7 | 11.1 | — | 11.6 | 13 | 12.1 |
| Phenolic novolac resin[2] | 17.6 | 18.3 | — | 19.2 | 21.5 | 19.9 |
| Shellac resin, dewaxed | — | — | 2.2 | — | — | — |
| Phenolic resin[3] | — | — | 21.9 | — | — | — |
| Partially isobutylated melamine[4] | — | — | 3.5 | — | — | — |
| Maleic modified rosin ester[5] | — | — | 6.5 | — | — | — |
| Pigment black[6] | 2.5 | — | — | 2.5 | 2.7 | 2.5 |
| Monazo copper complex dye[7] | — | — | 0.1 | — | — | — |
| Organoclay rheological additive[8] | 2.5 | 2.5 | — | 2.5 | — | 2.5 |
| Talc[9] | 14 | 14 | — | 14 | — | — |
| Talc[10] | — | — | — | — | — | 14 |
| Talc[11] | — | — | 22.1 | — | — | — |
| Fumed silica[12] | — | — | — | — | 10.7 | — |
| Fumed silica[13] | — | — | 3.5 | — | — | — |
| Micronised amide wax rheology modifier[14] | 5 | 5 | — | 2.5 | — | — |
| Polyacrylate flow aid[15] | — | — | 2.2 | — | — | — |
| Optical brightener[16] | — | 0.08 | — | — | — | — |
| Total | 100 | 100.00 | 100 | 100 | 100 | 100 |

[1]Mowilith CT-5 (Hoechst Celanese Corp.)
[2]FRJ-425 (SI Group)
[3]Alnovol PN320 (Cytec)
[4]Cymel MI-12 (Cytec)
[5]FlexRez 5700 (Lawter)
[6]Regal 300R (Cabot Corp)
[7]Orgalon Blue 603 (Kelly Chemical Corp)
[8]Tixogel TE (Southern Clay Products, Inc.)
[9]Cimpact 699 (Imerys)
[10]Mistron ZSC prod (Imerys)
[11]Micro Talc IT (Norwegian Talc)
[12]Aerosil 200 (Evonik)
[13]Cabosil M5 (Cabot Corporation)
[14]Crayvallac Super (Arkema Inc.)
[15]Modaflow (Cytec)
[16]Benetex OB (Cytec)

It is noted that the example compounds/products provided in the footnotes to Table 1 are commonly available versions of the listed compound. Equivalent compounds, having the same properties, can obviously be substituted, as may be desired.

The Example 1, 1A, 2 and 3 inventive etch resist compositions have a measurably better capability to print fine lines as compared to comparative examples 4 and 5. This is because the high levels of talc improve rheology and adhesion. The talc in Examples 1, 1A, and 3 are uncoated, and this type of talc disperses better and gives better print resolution compared, for example, to the coated talc in Example 5.

Figure 3:
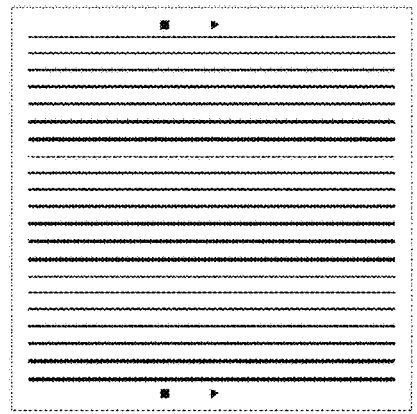
FIG. 3 depicts an exemplary test screen pattern for printing etch resists according to exemplary embodiments of the present invention.

The print resolution was evaluated using a screen pattern comprised of a series of gradually narrower line openings. These open areas can be printed as negative areas to test the ability of an etch resist to print sharp reverse features without spreading. The screen pattern is shown in FIG. 3. With reference thereto, the black lines represent the non-print areas. The white area is open area of the screen. The print is a solid area of etch resist with open lines. The pattern consists of three repeating sets of lines of the following widths: 200, 175, 150, 125, 100, 75, and 50 microns. Thus, when printed, the three sets of lines have no etch resist, and are thus where the passivation layer will be removed during etching.

Table 2 below summarizes the comparative print resolution, as expressed by the finest line in the line series pattern of FIG. 3, that can be obtained by the exemplary printing, etching, and stripping processes described herein. Table 2 also lists (i) the 10% w/w hydrofluoric acid (HF) solution contact time that can be tolerated by the etch resist without undercutting of the substrate by the etchant solution, and (ii) the time in seconds required to strip the printed etch resist in the stripping step, which follows the etching step. The stripping bath used was a 3% KOH w/v aqueous solution at ambient temperature.

TABLE 2

Summary of Etch Resist Properties

| Example | Print Resolution (μm) | 10% HF Resistance (min.) | Strippability in 3% KOH, (sec.) |
| --- | --- | --- | --- |
| Inventive Example 1 | 50 | >5 | 30 |
| Inventive Example 2 | 75 | >5 | 30 |
| Inventive Example 3 | 100 | 5 | 60 |
| Comparative Example 4 | 125 | 2 | 10 |
| Comparative Example 5 | 175 | 4 | 180 |
| Competitive etch resist[1] | >200 | 3 | >300 |

[1]Daxin SCRP110

The data summarized in Table 2 shows the print resolution, hydrofluoric acid resistance, and the strippability of an exemplary etch resist composition and of prior art formulations. The print resolution in microns describes the narrowest reverse-opening line feature of passivation layer that can be obtained by the process. This feature is the patterned area that is unprotected and etched away while the rest of the passivation layer is protected during the etching bath step of the process. The exemplary process involves printing the screen pattern shown in FIG. 3, then etching the printed wafer in a 10% solution of hydrofluoric acid, or a mixture of hydrofluoric acid and nitric acid, or another etching bath composition, for a period of time sufficient to etch away a silicon nitride passivation layer, or other passivation layer, to some desired depth of the substrate wafer. The desired depth may be, for example, just enough to remove the passivation layer to expose the silicon, or the process may require deeper etching, and a longer contact interval with the etching bath to remove some of the silicon in addition to just the passivation layer. The final step of this process is to then strip away the etch resist. The narrowest feature size of opened passivation layer, which had been etched away by the etch resist, is the reported value for print resolution. Thus, a lower reported value for micron width of feature obtained is preferable, since it indicates a higher print resolution, a better capability to obtain a fine line or a smaller feature, and ultimately a more intricate pattern and a greater degree of control in producing the final product. For example, the prior art formulation listed in Table 1 as Comparative Example 5, has a print resolution of 175 microns, which means that this is the smallest feature that can be formed using this particular etch resist. Inventive Example 1, which lists a print resolution of 50 microns, can be screen printed at a high enough resolution that a feature of 50 microns can be patterned using the process.

The second data column of Table 2, describing 10% HF etchant bath resistances, is a comparison of acid resistance of printed etch resists. The values indicate the amount of time in minutes that the printed etch resist can withstand exposure to a standard etching bath composition without breaking down and permitting undercutting of the protected areas. When undercutting occurs, the etching solution penetrates under the printed etch resist and etches away some of the passivation layer or of the underlying silicon, which is undesirable. A more acid resistant etch resist will be able to withstand a longer exposure time to an etching bath, and will then allow more flexibility to the process, since a longer exposure time may be required to obtain an optimal depth of etching, or to remove various passivation stacks. Finally, the third data column presents the strippability of the etch resist. This is defined by measuring the time in seconds required to fully remove the etch resist using a standard alkali stripping solution. Here a shorter stripping time is desirable, because this improves the process throughput. An ideal etch resist will have a high degree of resistance and impermeability to various etching baths, but will have very poor resistance to the desired stripping solution. A typical stripping bath is an aqueous solution of alkali, such as potassium hydroxide solution or sodium hydroxide solution in the range of 2% to 5% by weight, and within a temperature range of 20° C. to 50° C. The standard stripping solution chosen for the comparisons reported in Table 2 was 3% KOH at 22° C.

Etch resists were evaluated by screen printing using a 325 mesh screen and 80 durometer squeegee onto one-inch square mono-crystalline silicon wafers coated with a passivation layer of silicon nitride. The screen pattern used in these tests is shown in FIG. 3. The wafers were printed so that the printed lines were reverse features. In other words, the black lines of FIG. 3 represent unprinted areas on the wafer where the etchant should remove the passivation layer. The screen pattern consists of three repeating series of open lines with widths of 200, 175, 150, 125, 100, 75, and 50 microns. The etch resists were dried for three minutes at 140° C. The printed wafers were exposed to 10% w/w hydrofluoric acid solution etching bath for specified intervals of time and then rinsed using tap water. Next, the etch resist was removed using a stripping bath of 3% w/vol. aqueous solution of KOH at ambient temperature. The wafers were immersed in the stripping bath for 10 second time intervals with slight agitation until the etch resist had been removed. The wafers were allowed to air dry, and were then inspected for the quality of passivation layer areas which were the areas covered with the etch resist. The print resolution was determined by the narrowest intact line of removed passivation layer that could be obtained by the process. The hydrofluoric acid solution resistance was determined by immersing printed wafers into an etching bath of 10% w/w hydrofluoric acid for variable periods of time and then analyzing the quality of the etch resist printed areas of the passivation layer. Etch resists with lower etchant resistance show damage to the printed passivation layer after relatively shorter etchant contact times in the areas where the etch resist was printed and which were intended to be protected from the etchant bath. Breach of the etch resist in printed areas was detectable as visual changes in the color and appearance of the underlying silicon nitride in the case of minor damage, or complete removal of silicon nitride passivation down to the underlying silicon in printed areas for the case of severe damage to the etch resist layer. The longest contact time used in the testing was 5 minutes. The etch resists with the best hydrofluoric acid (HF) resistance were those that showed no damage to printed areas of the passivation layer after 5 minutes of contact time in the 10% w/w HF etching bath.

Thus, exemplary compositions according to the present invention all provide the useful combination of functionalities as described above in connection with Table 2. Namely, fine print resolution (e.g., 100 microns or less), high etch resist time (e.g., greater than five minutes), in which undercutting of the substrate does not occur, and small time in seconds (e.g., 60 seconds or less) required to strip the printed etch resist in the stripping step, which follows the etching step. As noted above, unless otherwise specified, or obvious from the context, all percentages described herein are by weight (w/w).

The present invention has been described in detail, including various preferred exemplary embodiments thereof. However, it will be appreciated that those skilled in the art, upon consideration of the present disclosure, may make modifications and/or improvements on this invention that fall within the scope and spirit of the invention.

What is claimed is:

1. A composition of matter, comprising:
    organic compounds comprising:
        a phenol-formaldehyde resin; a vinyl polymer or copolymer; a vinyl acetate polymer or copolymer; a rosin resin or a modified rosin resin; a rosin polyester; a gum rosin or a modified ester of a gum rosin; shellac; melamine or modified melamine resin, cyclized rubber, Gilsonite® or uintahite resin or combinations thereof;
    one or more solvents; and
    a rheological modifier;
    wherein the composition of matter is suitable for use as an etch resist or plating resist in a process for manufacturing passivated emitter rear contact (PERC) solar cells.

2. The composition of matter of claim 1, wherein the rheological modifier comprises at least one of (i) micronized amide wax, (ii) silica, (iii) silica and clay, (iv) talc, and (v) talc and clay.

3. The composition of matter of claim 1, wherein the organic compounds include one of: (i) 1.0% to 40% vinyl acetate copolymer and 5.0% to 50% phenolic novolac, and (ii) 5.0 to 15% vinyl acetate copolymer and 15 to 25% phenolic novolac.

4. The composition of matter of claim 1, wherein the organic compounds include one of: (i) 0.1% to 30% shellac resin; 0.10% to 50% phenolic resin; 0.10% to 75% partially isobutylated melamine resin; 0.10% to 50% maleic modified rosin ester, and (ii) 1.0 to 10% shellac resin; 15% to 25% phenolic resin; 1.0 to 5.0% partially isobutylated melamine resin; and 2.0 to 8.0% maleic modified rosin ester.

5. The composition of matter of claim 1, wherein the one or more solvents include one of: (i) 5%-30% ethylene glycol monobutyl ether and 10%-40% diethylene glycol mono ethyl ether acetate, and (ii) 15-20% ethylene glycol monobutyl ether and 25-30% diethylene glycol mono ethyl ether acetate.

6. The composition of matter of claim 1, wherein the one or more solvents include one of: (i) 5%-35% ethylene glycol monobutyl ether and 5%-25% diethylene glycol butyl ether, and (ii) 20-25% ethylene glycol monobutyl ether and 10-15% ethylene glycol butyl ether.

7. The composition of matter of claim 1, wherein the one or more solvents include one of: 5%-30% diethylene glycol monoethyl ether and 10%-40% diethylene glycol mono ethyl ether acetate, and (ii) 15-20% diethylene glycol monoethyl ether and 25-30% diethylene glycol mono ethyl ether acetate.

8. The composition of matter of claim 1, wherein the rheological modifier includes one of: (i) 0.1% to 12% organoclay rheological additive; 2.0% to 35% uncoated talc; and 0.1% to 15% of an amide wax rheological modifier or micronized amide wax rheological modifier, and (ii) 1.0 to 5.0% organoclay rheological additive; 10 to 15% uncoated talc; and 3.0 to 6.0% amide wax rheology modifier or micronized amide wax rheological modifier.

9. The composition of matter of claim 1, wherein the rheological modifier includes one of: (i) 1.0 to 30% talc; 1.0% to 40% fumed silica; and 0.1% to 15% polyacrylate flow aid; and (ii) 20 to 25% talc; 5.0% to 15% fumed silica; and 1.0% to 5.0% polyacrylate flow aid.

10. The composition of matter of claim 1, wherein the organic compounds include 5-20% vinyl acetate copolymer and 10-30% phenolic novolac.

11. The composition of matter of claim 1, further comprising at least one of (i) one or more inorganic fillers, (ii) a colorant pigment or dye, and (iii) an optical brightener.

12. The composition of matter of claim 1, wherein the rheological modifier comprises a derivative of an unsaturated oil or triglyceride.

13. The composition of matter of claim 12, wherein the unsaturated oil or triglyceride is present at 2.5-5%, and comprises micronized amide wax.

14. The composition of matter of claim 12, wherein the derivative of an unsaturated oil or triglyceride is an epoxidized, maleated or fumarated derivative of said unsaturated oil or triglyceride.

15. The composition of matter of claim 12, wherein the derivative of an unsaturated oil or triglyceride is a modified castor oil.

16. The composition of matter of claim 1, wherein the rheological modifier includes a hydrocarbon, amide or polyamide wax.

17. The composition of matter of claim 16, wherein the hydrocarbon, amide or polyamide wax is present at one of (i) 0.1% to 25%, and (ii) 1-10%.

18. The composition of matter of claim 1 that is sufficiently shear thinning, and has the rheology and viscosity to be screen-printable.

19. The composition of matter of claim 2 that is sufficiently shear thinning, and has the rheology and viscosity to be screen-printable.

20. The composition of matter of claim 3 that is sufficiently shear thinning, and has the rheology and viscosity to be screen-printable.

21. The composition of matter of claim 4, wherein the one or more solvents are sufficiently high boiling so as to have screen stability.

22. The composition of matter of claim 5, wherein the one or more solvents are sufficiently high boiling so as to have screen stability.

23. The composition of matter of claim 6, wherein the one or more solvents are sufficiently high boiling so as to have screen stability.

24. A method of fabricating a PERC cell, comprising printing the composition of matter of claim 1 as an etch resist onto a silicon solar cell wafer, wet etching the wafer, and performing an etch resist removal process on the wafer.

25. A method of fabricating a PERC cell, comprising printing the composition of matter of claim 2 as an etch resist onto a silicon solar cell wafer, wet etching the wafer, and performing an etch resist removal process on the wafer.

26. A method of fabricating a PERC cell, comprising printing the composition of matter of claim 3 as an etch resist onto a silicon solar cell wafer, wet etching the wafer, and performing an etch resist removal process on the wafer.

27. A method of fabricating a PERC cell, comprising printing the composition of matter of claim 4 as an etch resist onto a silicon solar cell wafer, wet etching the wafer, and performing an etch resist removal process on the wafer.

28. A method of fabricating a PERC cell, comprising printing the composition of matter of claim 5 as an etch resist onto a silicon solar cell wafer, wet etching the wafer, and performing an etch resist removal process on the wafer.

29. A method of fabricating a PERC cell, comprising printing the composition of matter of claim 6 as an etch resist onto a silicon solar cell wafer, wet etching the wafer, and performing an etch resist removal process on the wafer.

30. A method of fabricating a PERC cell, comprising printing the composition of matter of claim 7 as an etch resist onto a silicon solar cell wafer, wet etching the wafer, and performing an etch resist removal process on the wafer.

31. A method of fabricating a PERC cell, comprising printing the composition of matter of claim 8 as an etch resist onto a silicon solar cell wafer, wet etching the wafer, and performing an etch resist removal process on the wafer.

* * * * *